United States Patent
Yamasaki et al.

(10) Patent No.: US 10,020,409 B2
(45) Date of Patent: Jul. 10, 2018

(54) METHOD FOR PRODUCING A CONDUCTIVE REFLECTIVE FILM

(75) Inventors: Kazuhiko Yamasaki, Naka-gun (JP); Yoshiaki Takata, Naka-gun (JP); Toshiharu Hayashi, Naka-gun (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 13/572,360

(22) Filed: Aug. 10, 2012

(65) Prior Publication Data

US 2012/0308720 A1 Dec. 6, 2012

Related U.S. Application Data

(62) Division of application No. 12/596,125, filed as application No. PCT/JP2008/057595 on Apr. 18, 2008.

(30) Foreign Application Priority Data

Apr. 19, 2007 (JP) .................................. 2007-110598
Apr. 1, 2008 (JP) .................................. 2008-095008

(51) Int. Cl.
| | | |
|---|---|---|
| H01L 31/04 | (2014.01) | |
| G02B 5/08 | (2006.01) | |
| H01L 31/0224 | (2006.01) | |
| H01L 31/056 | (2014.01) | |
| B82Y 20/00 | (2011.01) | |
| B82Y 30/00 | (2011.01) | |
| H01B 1/22 | (2006.01) | |
| H01L 31/0352 | (2006.01) | |

(52) U.S. Cl.
CPC .............. *H01L 31/04* (2013.01); *B82Y 20/00* (2013.01); *B82Y 30/00* (2013.01); *G02B 5/0808* (2013.01); *H01B 1/22* (2013.01); *H01L 31/022425* (2013.01); *H01L 31/0352* (2013.01); *H01L 31/056* (2014.12); *Y02E 10/52* (2013.01); *Y10T 428/24997* (2015.04); *Y10T 428/249978* (2015.04); *Y10T 428/249979* (2015.04)
USPC .............................. 427/74; 427/125; 427/191

(58) Field of Classification Search
USPC .......................................... 427/125, 191, 74
See application file for complete search history.

(56) References Cited

U.S. PATENT DOCUMENTS

| | | |
|---|---|---|
| 5,136,351 A | 8/1992 | Inoue et al. |
| 5,282,902 A | 2/1994 | Matsuyama et al. |
| 5,378,408 A | 1/1995 | Carroll et al. |
| 5,957,828 A | 9/1999 | Hayashi |
| 6,071,437 A | 6/2000 | Oya |
| 6,086,790 A | 7/2000 | Hayashi et al. |
| 6,117,366 A * | 9/2000 | Park et al. ............... 252/512 |
| 6,136,228 A * | 10/2000 | Hirai et al. ............... 252/512 |
| 6,366,333 B1 | 4/2002 | Yamamoto et al. |
| 6,451,433 B1 | 9/2002 | Oka et al. |
| 7,940,447 B2 * | 5/2011 | Wu et al. ............... 359/265 |
| 2004/0046154 A1 | 3/2004 | McVicker et al. |
| 2004/0259007 A1 | 12/2004 | Takahashi et al. |
| 2005/0116203 A1 | 6/2005 | Takahashi et al. |
| 2006/0073667 A1* | 4/2006 | Li ............... B22F 1/0018 438/311 |
| 2006/0083694 A1 | 4/2006 | Kodas et al. |
| 2006/0189113 A1* | 8/2006 | Vanheusden ........... B22F 1/0018 438/597 |
| 2006/0231801 A1* | 10/2006 | Carroll et al. ............... 252/500 |
| 2008/0063874 A1* | 3/2008 | Rakow et al. ............... 428/426 |
| 2008/0134936 A1 | 6/2008 | Kamikoriyama et al. |
| 2009/0053469 A1 | 2/2009 | Sato et al. |
| 2009/0250106 A1 | 10/2009 | Hayashi et al. |
| 2010/0096002 A1 | 4/2010 | Hayashi et al. |
| 2013/0099179 A1* | 4/2013 | Vanheusden et al. ........ 252/514 |

FOREIGN PATENT DOCUMENTS

| | | |
|---|---|---|
| EP | 1775734 A2 | 4/2007 |
| JP | 63-213974 A | 9/1988 |
| JP | 64-054768 A | 3/1989 |
| JP | 02-7476 A | 1/1990 |
| JP | 03-099477 A | 4/1991 |
| JP | 03-099478 A | 4/1991 |
| JP | 4-218977 A | 8/1992 |
| JP | 04-334069 A | 11/1992 |
| JP | 05-095127 A | 4/1993 |
| JP | 06-196728 A | 7/1994 |
| JP | 06-300907 A | 10/1994 |
| JP | 07-106617 A | 4/1995 |
| JP | 07-330337 A | 12/1995 |
| JP | 09-115438 A | 5/1997 |
| JP | 09-246577 | 9/1997 |

(Continued)

OTHER PUBLICATIONS

Office Action of the corresponding Japanese Application No. 2008-095008 mailed Aug. 28, 2012.
Official Inquiry mailed Nov. 27, 2012 for the corresponding Japanese Patent Application No. 2006-307307.
Office Action mailed Dec. 6, 2012 for the corresponding Taiwanese Patent Application No. 096109518.
Office Action of the corresponding Japanese Application No. 2006-305409 mailed May 8, 2012.
Decision of Rejection of the corresponding Japanese Application No. 2006-307307 mailed May 8, 2012.
Office Action mailed Jul. 7, 2011 for the related U.S. Appl. No. 12/306,884.
Office Action mailed Jun. 22, 2011 for the related U.S. Appl. No. 12/444,720.

(Continued)

*Primary Examiner* — Brian K Talbot
(74) *Attorney, Agent, or Firm* — Leason Ellis LLP

(57) ABSTRACT

A conductive reflective film which is formed by calcining a substrate on which a composition containing metal nanoparticles is coated, the conductive reflective film including pores which appear on the film contact surface in the substrate side having an average diameter of 100 nm or less, an average depth of 100 nm or less in terms of position of the pores, and a number density of the pores of 30 pores/$\mu m^2$ or less.

5 Claims, No Drawings

(56) References Cited

FOREIGN PATENT DOCUMENTS

| | | |
|---|---|---|
| JP | 10-001777 A | 1/1998 |
| JP | 10-73704 A | 3/1998 |
| JP | 10066861 | 3/1998 |
| JP | 10-188681 A | 7/1998 |
| JP | 10326522 | 12/1998 |
| JP | 11-045619 | 2/1999 |
| JP | 11329070 | 11/1999 |
| JP | 2000090737 | 3/2000 |
| JP | 2000-239853 A | 9/2000 |
| JP | 2001313400 | 11/2001 |
| JP | 2001325831 | 11/2001 |
| JP | 2002-025942 A | 1/2002 |
| JP | 3287754 | 3/2002 |
| JP | 2002-198547 A | 7/2002 |
| JP | 2002-237214 A | 8/2002 |
| JP | 2003-132734 A | 5/2003 |
| JP | 2003-179241 A | 6/2003 |
| JP | 2003-273041 A | 9/2003 |
| JP | 2004-006263 A | 1/2004 |
| JP | 2004-143325 | 5/2004 |
| JP | 2004-143571 A | 5/2004 |
| JP | 2004-182487 A | 7/2004 |
| JP | 2004-182812 A | 7/2004 |
| JP | 2004-296801 A | 10/2004 |
| JP | 2005-002387 A | 1/2005 |
| JP | 2005-015647 A | 1/2005 |
| JP | 2005504409 | 2/2005 |
| JP | 2005-191107 A | 7/2005 |
| JP | 2005-243500 A | 9/2005 |
| JP | 2005-268547 A | 9/2005 |
| JP | 2005-353904 A | 12/2005 |
| JP | 2006-193594 A | 7/2006 |
| JP | 2006-210301 A | 8/2006 |
| TW | 200510493 | 3/2005 |
| TW | I 229108 | 3/2005 |
| TW | 200622454 A | 7/2006 |
| WO | WO-03025954 | 3/2003 |
| WO | WO-03085052 | 10/2003 |
| WO | WO-2006/061557 A1 | 6/2006 |
| WO | WO-2006/070747 A1 | 7/2006 |
| WO | WO-2006/076611 A2 | 7/2006 |
| WO | WO-2006/109799 A | 10/2006 |
| WO | WO-2007/080997 A1 | 7/2007 |

OTHER PUBLICATIONS

Office Action mailed Feb. 14, 2012 for the related U.S. Appl. No. 12/444,720.

Yanagida et al., Frontier development of thin film solar cells-towards higher efficiency, large scale production, and widespread promotion, Mar. 10, 2005, pp. 112-116, NTS Corporation (partial English translation provided).

European Search Report mailed on Dec. 27, 2010 for the corresponding European Application No. 08740650.0.

Office Action mailed Nov. 2, 2011 for the parent U.S. Appl. No. 12/596,125.

Office Action mailed Aug. 8, 2012 for the parent U.S. Appl. No. 12/596,126.

Office Action mailed Feb. 25, 2013 for the related Taiwanese Patent Application No. 096138019.

Appeal Decision mailed Apr. 2, 2013 for the related Japanese Application No. 2006-307307.

Notice of Allowance mailed Jun. 4, 2013 for the related Japanese Application No. 2006-305508.

Office Action mailed Jun. 6, 2013 for the related U.S. Appl. No. 12/306,884.

Notice of Allowance mailed Nov. 12, 2013 for the related Japanese Patent Application 2012-083491.

Office Action mailed Aug. 13, 2013 for the related Japanese Patent Application No. 2012-229394.

Office Action mailed Sep. 17, 2013 for the related Japanese Patent Application No. 2012-083491.

Office Action mailed Oct. 8, 2013 for the related Japanese Patent Application No. 2012-160131.

Office Action mailed Apr. 30, 2014 for the related Japanese Application No. 2013-013983.

Office Action dated Nov. 13, 2014 for the corresponding German Application No. 11 2007 001 507.1.

* cited by examiner

METHOD FOR PRODUCING A CONDUCTIVE REFLECTIVE FILM

CROSS REFERENCE TO RELATED APPLICATION

This application is a Divisional of U.S. patent application Ser. No. 12/596,125 filed Oct. 15, 2009, which is the U.S. national phase application under 35 U.S.C. § 371 of International Patent Application No. PCT/JP2008/057595 filed Apr. 18, 2008, which claims the benefit of Japanese Application No. 2007-110598, filed Apr. 19, 2007 and Japanese Application No. 2008-095008, filed Apr. 1, 2008. The International Application was published on Oct. 30, 2008 as International Publication No. WO/2008/130031 under PCT Article 21(2). The contents of these applications are incorporated herein in their entirety.

BACKGROUND OF THE INVENTION

1. Field of the Invention

The present invention relates to a conductive reflective film, which is formed by coating a composition containing metal nanoparticles using a wet coating method and calcining the resultant, has high reflectance when measured from the substrate side, and exhibits a low specific resistance as much as that of a bulk, and a method for producing the same.

2. Description of the Related Art

Research and development in the field of clean energy technologies are currently promoted from the environmental protection standpoint. Solar cells in particular are drawing attention since their energy source is sunlight, which is infinite and free from environmental pollution. Conventionally, a bulk solar cell, which employs a semiconductor prepared by slicing a bulk crystal such as monocrystalline silicon and polycrystalline silicon into a thick plate, has been used for photovoltaic power generation. However, the above silicon crystals used in the bulk solar cell require a large amount of energy and time for crystal growth as well as a complex step in the subsequent production process, thereby making it difficult to increase production efficiency and to provide solar cells at low cost.

On the other hand, in a so-called thin film semiconductor solar cell (hereinafter referred to as a thin film solar cell), in which a semiconductor layer made of amorphous silicon or the like having a thickness of a few micrometers or less is used as a photoelectric conversion layer, semiconductor layers which are to become photoelectric conversion layers may be formed as many as required on a low cost substrate such as glass or stainless steel. Accordingly, it is expected that this thin film solar cell will become a major type of solar cell in the future for its reduced size and weight, low production cost, and easy modification in terms of area increase.

The thin film solar cell is classified into a super straight type and sub straight type based on its configuration. The super straight type solar cell in which light enters from the transparent substrate side usually has a structure where the substrate, a transparent electrode, a photoelectric conversion layer, and a back surface electrode are formed in this order. In the super straight type solar cell in which the photoelectric conversion layer is formed of a silicon-based material, there has been a study in order to enhance its power generation efficiency by producing the cell with a structure where, for example, a transparent electrode, an amorphous silicon, a polycrystalline silicon, and a back surface electrode are formed in this order (for example, refer to Shozo Yanagida et al "Frontier developments of thin film solar cells—towards higher efficiency, large scale production, and widespread promotion" published by NTS Corporation, March, 2005, pp. 113, FIG. 1 (a) ("Yanagida"). In the structure described in Yanagida, the amorphous silicon and the polycrystalline silicon form a photoelectric conversion layer.

When the photoelectric conversion layer in a solar cell is configured from a silicon-based material, the photoelectric conversion layer will have a relatively low absorption coefficient due to the above material. Accordingly, when the photoelectric conversion layer has a film thickness on the order of a few micrometers, part of the incident light will transmit the photoelectric conversion layer, and this transmitted light does not contribute to power generation. For this reason, the power generation efficiency is generally improved by reflecting the light, which is not absorbed and which transmits the photoelectric conversion layer, with a reflective film in order to return the light back to the photoelectric conversion layer by either making the back surface electrode function as a reflective film or forming a reflective film on the back surface electrode.

Electrodes and reflective films have been formed by the vacuum film forming methods such as the sputtering method in the development of thin film solar cells to date. However, considerable cost was generally required for the maintenance and operation of a large film forming apparatus. Hence, use of the wet film forming methods instead of the vacuum film forming methods for forming these electrodes and reflective films has been studied, and it is expected that the switching to the wet film forming methods will considerably improve the running cost of the apparatus.

Examples of the conductive reflective film formed by a wet film forming method include the reflective film disclosed in, for example, Japanese Unexamined Patent Application, First Publication No. Hei 5-95127 (sections [0015], [0020] and [0021] on the detailed description of the invention) ("JP '127") which is formed in the back surface side of a photoelectric conversion element using the electroless plating method. With the method shown in JP '127, the document describes possible improvements in productivity by forming the reflective film using the electroless plating method. Specifically, in the above method, a resist film which will be a protective film for the plating is first formed in the front surface side of a substrate by overall printing, and then a pretreatment is conducted in the back surface side of the substrate using a solution, in which HF is added in a proportion of 2 to 4% by mass to the pretreatment solution for a non-conductor. Thereafter, a reflective layer composed of a copper plating film having a thickness of about 3 µm is formed using an electroless plating solution. Then this substrate is subjected to an ultrasonic cleaning process in a solvent to remove the resist film, thereby forming a photoelectric conversion element.

However, in the electroless plating method shown in the above JP '127, the protective film for the plating is first formed in the front surface side of the substrate followed by the pretreatment of the side, which will be subjected to a plating treatment, using the HF solution, and thereafter a process for immersing the substrate is conducted. Accordingly, generation of waste liquid in addition to the complicated production process is expected to become a problem.

As a simpler method, a method is disclosed where a solution, in which ultrafine metal particles are dispersed in an organic solvent, is coated and followed by a sintering process at a low temperature of 100 to 250° C. (for example, refer to Japanese Unexamined Patent Application, First Publication No, Hei 9-246577 (section [0035] on the detailed description of the invention) ("JP '577")). With the method shown in the above JP '577, without employing a high vacuum process, it is possible to form a metal electrode having high reflectance as well as high conductivity and which has a large area while being uniform.

However, the metal film obtained by the method shown in the above JP '577 tends to have lower reflectance in the substrate side compared to the reflectance in the side of an exposed surface, which is situated in the opposite side. This is because pores are usually generated between a metal film and a substrate, on which the film is formed, when forming the metal film by coating the dispersion liquid containing ultrafine metal particles onto the substrate and calcining the resultant. When pores are generated between the metal film and the substrate, it is assumed that the light entering inside the pores is ultimately attenuated due to the repeated reflection inside the pores. In addition, the reflected light that reached the substrate side is also assumed to be attenuated when its angle of incidence with respect to the substrate surface is large. This may be due to the increase in the proportion of light, which is totally reflected at the interface between a medium with a low refractive index (i.e., the air inside the pores) and a medium with a high refractive index (i.e., the substrate), and the attenuation occurring in accordance with the proportion.

As an example of the method to form a metal coating film exhibiting high reflectance and plating-like metallic luster on the substrate surface, a method is disclosed in which a metal thin film is formed by coating a coating material containing metal colloidal particles onto a substrate, drying the resulting coating film, and thereafter heating this coating film to fuse the colloidal particles in this coating film (for example, refer to Japanese Unexamined Patent Application, First Publication No. 2000-239853 (sections [0015], [0097] and [0098] on the detailed description of the invention) ("JP '853")). However, the reflectance on the substrate side is not considered even with the method shown in JP '853.

SUMMARY OF THE INVENTION

When a reflective film is formed by coating a dispersion liquid containing metal nanoparticles followed by a sintering process and its reflectance is evaluated from the side of a transparent substrate such as glass, the reflectance tends to be considerably lower than that evaluated from the exposed surface side, which is the opposite side.

An object of the present invention is to provide a conductive reflective film, which is formed without employing a vacuum process, has a high reflectance when measured from the substrate side and also capable of being used as an electrode for solar cells, and exhibits a specific resistance as low as that of a bulk. The present invention also relates to a method for producing the same.

The present inventors extensively studied the reflectance measured from the substrate side of the reflective film, which is formed by coating a dispersion liquid of metal nanoparticles followed by a sintering process. As a result, it was discovered that reducing the size of the pores appearing in a predetermined depth of the contacting surface in the film substrate side and also reducing the number density of the pores are effective in order to achieve 80% or more reflectance from the substrate side in terms of light having a wavelength within a range of 500 to 1200 nm.

Concerning the pores appearing on the surface of the film which is the surface in the side contacting the substrate, adjustments in the film forming conditions will achieve an average diameter of 100 nm or less in terms of pore size, an average depth of 100 nm or less in terms of pore position, and a number density of 30 pores/$\mu m^2$ or less.

It should be noted here that the pores having their deepest portion at a depth of 10 nm or less will be excluded from the target specified above since their influence on the reflectance measured from the substrate side is negligible.

In the conductive reflective film of the present invention, the pores appearing on the film contact surface in the substrate side will have an average diameter of 100 nm or less in terms of pore size, an average depth of 100 nm or less in terms of pore position, and a number density of 30 pores/$\mu m^2$ or less. Due to the above conditions, the conductive reflective film of the present invention can achieve a high diffuse reflectance, which is 80% or more of the theoretical reflectance, within a wavelength range of 500 to 1200 nm when a transparent substrate having a transmittance of 98% or more is used. This wavelength range of 500 to 1200 nm covers almost the entire wavelength of convertible light when polycrystalline silicon is used in the photoelectric conversion layer. Moreover, the conductive reflective film of the present invention can achieve a specific resistance which is comparable to that of the metal itself that constitutes the metal nanoparticles contained in the coating composition. In other words, the obtained specific resistance is as low as that of the bulk, which can be used as an electrode for solar cells. In addition, the conductive reflective film of the present invention is superior to the films formed by the vacuum process such as a sputtering process in terms of reflectance and adhesive properties of the film and long-term stability of the specific resistance.

DETAILED DESCRIPTION OF THE INVENTION

Next, preferred embodiments for carrying out the present invention will be described.

The composition for forming a conductive reflective film of the present invention is a composition which is prepared by dispersing metal nanoparticles in a dispersion medium. In the metal nanoparticles, the proportion of silver among the metal elements is 75% by mass or more and is preferably 80% by mass or more. The proportion of silver among the metal elements is within the range of 75% by mass or more because the reflectance of the conductive reflective film formed by using this composition reduces when the proportion is less than 75% by mass. In addition, the metal nanoparticles are chemically modified by a protective agent which is an organic molecule having a carbon skeleton with 1 to 3 carbon atoms. The protective agent which chemically modifies the metal nanoparticles is an organic molecule having a carbon skeleton with 1 to 3 carbon atoms because when the agent having a carbon skeleton with 4 or more carbon atoms is used, it is difficult to eliminate or to decompose (remove/combust) the protective agent by the heat during the calcination process. Accordingly, a large amount of organic residues remain in the conductive reflective film resulting in a reduction of electrical conductivity and reflectance of the conductive reflective film due to the deterioration or the degradation of these residues.

It is preferable that the metal nanoparticles include, in terms of number average, 70% or more, more preferably 75% or more of the nanoparticles having a primary particle size within a range of 10 to 50 nm. The content of the metal nanoparticles having a primary particle size within a range of 10 to 50 nm is made 70% or more, in terms of the number average, with respect to the entirety of (100%) the metal nanoparticles because the proportion of organic matter increases as the specific surface area of metal nanoparticles increases when the content is less than 70%. For this reason, even when the organic molecule that is readily eliminated or decomposed (removed/combusted) by the heat during the calcination process is used, the proportion of this organic matter is high, thereby leaving a large amount of organic residues in the conductive reflective film resulting in the reduction of electrical conductivity and reflectance of the conductive reflective film due to the deterioration or the degradation of these residues. Another possible consequence is the broadening of particle size distribution of the metal nanoparticles and the reduction of density of the conductive reflective film, thereby reducing electrical conductivity and reflectance of the conductive reflective film. In addition, another reason to make the abovementioned primary particle size of the metal nanoparticles within a range of 10 to 50 nm is that there is a correlation between the metal nanoparticles having a primary particle size within a range of 10 to 50 nm and the aging stability which is revealed by statistical methods. Note that the average based on the number of particles is measured in the present invention by the following method. Firstly, the obtained metal nanoparticles are photographed using a transmission electron microscope (TEM) at a magnification of about 500 hundred thousands. Subsequently, the primary particles size of 200 metal nanoparticles selected from the obtained image is measured, and the particle size distribution is plotted based on the measurement results. Then the proportion of the number of metal nanoparticles having a primary particle size within a range of 10 to 50 nm among the entirety of the metal nanoparticles is determined from the produced particle size distribution.

It is preferable that this composition containing the metal nanoparticles further contains at least one additive selected from the group consisting of an organic polymer, a metal oxide, a metal hydroxide, an organic metal compound, and a silicone oil. Due to the organic polymer, the metal oxide, the metal hydroxide, the organic metal compound, and/or the silicone oil that is contained in the composition as an additive, the chemical bonding to the substrate or the anchoring effect thereto is increased, or the wettability between the metal nanoparticles and the substrate is improved. Thus the adhesive properties with the substrate can be improved without impairing electrical conductivity.

In addition, it is possible to adjust the grain growth among the metal nanoparticles due to the sintering process when the conductive reflective film is formed using this composition. Since no vacuum process is required when forming a conductive reflective film using this composition, there are few restrictions on the process and the cost for running manufacturing facilities can be reduced considerably.

The content of the additive is 0.1 to 20% by mass, preferably 0.2 to 10%, with respect to the silver nanoparticles that constitute the metal nanoparticles. It is possible that the additive content of less than 0.1% will result in the generation of pores having a large average diameter or the increase in the pore density. When the additive content exceeds 20%, the electrical conductivity of the formed conductive reflective film is adversely affected causing deficiencies such as a volume resistivity of over $2 \times 10^{-5}$ $\Omega \cdot cm$.

As the organic polymer used as an additive, at least one selected from the group consisting of polyvinylpyrrolidone (hereinafter referred to as PVP), copolymers of PVP, and water-soluble cellulose is used. Specific examples of the copolymers of PVP include a PVP-methacrylate copolymer, a PVP-styrene copolymer, and a PVP-vinyl acetate copolymer. Examples of the water-soluble cellulose include cellulose ethers such as hydroxypropylmethylcellulose, methylcellulose, and hydroxyethylmethylcellulose.

As the metal oxide to be used as an additive, the oxides containing at least one metal selected from the group consisting of aluminum, silicon, titanium, chromium, manganese, iron, cobalt, nickel, silver, copper, zinc, molybdenum, tin, indium, and antimony, or the composite oxides are preferable. Specific examples of the composite oxides include the indium tin oxide (ITO)-based composite oxides, the antimony tin oxide (ATO)-based composite oxides, and the indium zinc oxide (IZO)-based composite oxides.

As the metal hydroxide to be used as an additive, the hydroxides containing at least one metal selected from the group consisting of aluminum, silicon, titanium, chromium, manganese, iron, cobalt, nickel, silver, copper, zinc, molybdenum, tin, indium, and antimony are preferable.

As the organic metal compound to be used as an additive, a metal soap, a metal complex, or a metal alkoxide which contains at least one metal selected from the group consisting of silicon, titanium, chromium, manganese, iron, cobalt, nickel, silver, copper, zinc, molybdenum, and tin is preferable. Examples of the metal soap include chromium acetate, manganese formate, iron citrate, cobalt formate, nickel acetate, silver citrate, copper acetate, copper citrate, tin acetate, zinc acetate, zinc oxalate, and molybdenum acetate. Examples of the metal complex include a zinc acetylacetone complex, a chromium acetylacetone complex, and a nickel acetylacetone complex. Examples of the metal alkoxide include titanium isopropoxide, methyl silicate, isocyanatopropyltrimethoxysilane, and aminopropyltrimethoxysilane.

As the modified silicone oil, the following can be used; i.e., those produced by further introducing an organic group in a portion of the side chain of polysiloxane (side-chain type), those produced by introducing an organic group in both terminals of polysiloxane (two-terminal type), those produced by introducing an organic group in one of the two terminals of polysiloxane (one-terminal type), and those produced by introducing an organic group in a portion of the side chain of polysiloxane as well as in both terminals thereof (side-chain/two-terminal type). Reactive silicone oil and non-reactive silicone oil are available and both can be used as an additive in the present invention. Examples of the reactive silicone oil include amino-modified silicone oil, epoxy-modified silicone oil, carboxy-modified silicone oil, carbinol-modified silicone oil, mercapto-modified silicone oil, and heterogeneous functional group (epoxy group/amino group/polyether group)-modified silicone oil. Examples of the non-reactive silicone oil include polyether-modified silicone oil, methylstyryl-modified silicone oil, alkyl-modified silicone oil, higher fatty acid ester-modified silicone oil, fluorine-modified silicone oil, and hydrophilic specially modified silicone oil.

On the other hand, the metal nanoparticles constituting the composition apart from the silver nanoparticles preferably include the nanoparticles formed from one metal or the nanoparticles having a mixed composition or an alloy composition of two or more metals in which the metal is selected from the group consisting of gold, platinum, palladium, ruthenium, nickel, copper, tin, indium, zinc, iron, chromium, and manganese. The content of these metal nanoparticles excluding the silver nanoparticles is preferably 0.02% by mass or more and also less than 25% by mass with respect to the entirety of the metal nanoparticles (100% by mass), and more preferably within a range of 0.03 to 20% by mass. The content of these metal nanoparticles excluding the silver nanoparticles is set within the range of 0.02% to 25% by mass with respect to the entirety of the metal nanoparticles (100% by mass) for the following reasons. Although there are no major problems when the content is less than 0.02% by mass, electrical conductivity and reflectance of the conductive reflective film after the weathering test (a test where a subject is retained in a thermo-hygrostat set at a temperature of 100° C. and a humidity of 50% for 1,000 hours) do not deteriorate compared to those before the weathering test when the content is within the range of 0.02% to 25% by mass. In addition, the content of 25% by mass or more will result in the reduction of electrical conductivity and reflectance of the conductive reflective film immediately after the calcination process, and will also result in the reduction of electrical conductivity and reflectance of the conductive reflective film after the weathering test compared to those before the weathering test.

Moreover, the content of the metal nanoparticles in the composition including the silver particles is preferably within a range of 2.5 to 95.0% by mass and more preferably 3.5 to 90% by mass with respect to the entire composition (100% by mass), which is formed of the metal nanoparticles and a dispersion medium. The content of the metal nanoparticles including the silver particles is set within a range of 2.5 to 95.0% by mass with respect to the entire composition (100% by mass), which is formed of the metal nanoparticles and a dispersion medium, for the following reasons. Although there are no adverse effects in particular on the properties of the conductive reflective film after the calcination process when the content is less than 2.5% by mass, it will be difficult to achieve a conductive reflective film having a required thickness. On the other hand, the composition will lose its fluidity required as an ink or paste during a wet coating process when the content exceeds 95.0% by mass.

Additionally, the dispersion medium that constitutes the composition for forming the conductive reflective film of the present invention preferably contains at least 1% by mass and more preferably 2% by mass or more of water, and at least 2% by mass and more preferably 3% or more of a solvent, which is compatible with water such as alcohols, with respect to the entire dispersion medium (100% by mass). For example, when the dispersion medium is composed only of water and alcohols, the medium contains 98% by mass of alcohols when the water content is 2% by mass, and the medium contains 98% by mass of water when the alcohol content is 2% by mass. Moreover, the dispersion medium, that is, the protective molecule which chemically modifies the surface of metal nanoparticles contains either a hydroxyl group (—OH) or a carbonyl group (—C═O), or both. The preferable content of water is at least 1% by mass with respect to the entire dispersion medium (100% by mass) for the following reasons. When the content is less than 1% by mass, it is difficult to sinter the film, which is obtained by coating the composition employing a wet coating process, at a low temperature, and also results in the reduction of electrical conductivity and reflectance of the conductive reflective film after the calcination process. In addition, the preferable content of the solvent, which is compatible with water, is at least 2% by mass with respect to the entire dispersion medium (100% by mass) for the same reasons as above. That is, when the content is less than 2% by mass, it is difficult to sinter the film, which is obtained by coating the composition employing a wet coating process, at a low temperature, and also results in the reduction of electrical conductivity and reflectance of the conductive reflective film after the calcination process. It should be noted that when the protective agent, which chemically modifies the metal nanoparticles such as silver nanoparticles, contains a hydroxyl group (—OH), dispersion stability of the composition is excellent and the low-temperature sintering of coating film is also effective. Similarly, when the protective agent which chemically modifies the metal nanoparticles such as silver nanoparticles contains a carbonyl group (—C═O), dispersion stability of the composition is excellent and the low-temperature sintering of coating film is also effective. The solvent used in the dispersion medium which is compatible with water is preferably an alcohol. It is particularly preferable that the above alcohol to be used includes at least one alcohol selected from the group consisting of methanol, ethanol, propanol, butanol, ethylene glycol, propylene glycol, diethylene glycol, glycerol, isobonyl hexanol, and erythritol.

The method for producing the composition containing metal nanoparticles for forming the conductive reflective film of the present invention is as follows.

(a) When the Protective Agent which Chemically Modifies Silver Nanoparticles is an Organic Molecule Having a Carbon Skeleton with 3 Carbon Atoms Silver nitrate is first dissolved in water such as deionized water to prepare an aqueous metal salt solution. On the other hand, granular or powdery ferrous sulfate is directly added to an aqueous sodium citrate solution, which has a concentration of 10 to 40% and is obtained by dissolving sodium citrate in water such as deionized water, in an air flow of inert gas such as nitrogen gas for dissolution, thereby preparing an aqueous solution of a reducing agent containing citrate ions and ferrous ions at a molar ratio of 3:2. Then, while stirring the aqueous solution of a reducing agent in the air flow of inert gas, the abovementioned aqueous metal salt solution is added dropwise to mix with the aqueous solution of a reducing agent. It is preferable to adjust the concentration of each solution so that the amount of the aqueous metal salt solution added is 1/10 or less of the amount of the aqueous solution of a reducing agent in order to keep the reaction temperature between 30 and 60° C. even when the aqueous metal salt solution having room temperature is added. Additionally, the mixture ratio between both solutions is adjusted so that the equivalent of ferrous ions added as a reducing agent is 3 times higher than that of the metal ions. In other words, an adjustment is made so that (number of moles of the metal ions in the aqueous metal salt solution)×(valence of metal ions)=3×(number of moles of the ferrous ions in the aqueous solution of a reducing agent). After the dropwise addition of the aqueous metal salt solution is completed, stirring of the mixed solution is continued for another 10 to 300 minutes to prepare a dispersed liquid formed from a metal colloid. This dispersion liquid is allowed to stand at room temperature and the aggregates of precipitated metal nanoparticles are separated by decantation, centrifugal separation, or the like. Then water such as deionized water is added to this separated material to produce a dispersion liquid. The dispersion is subjected to a desalination treatment by employing ultrafiltration and then further subjected to displacement washing by an alcohol to achieve the metal (silver) content of 2.5 to 50% by mass. Thereafter, using a centrifugal separator, the silver nanoparticles are prepared by separating coarse particles due to the adjustment of the centrifugal force of this centrifugal separator so that 70% or more silver particles in terms of the number average have a primary particle size within a range of 10 to 50 nm. In other words, an adjustment is made so that the proportion of silver nanoparticles having a primary particle size within a range of 10 to 50 nm is, in terms of average based on numbers, 70% or more with respect to the entirety of the silver nanoparticles (i.e., 100%). Due to this adjustment, the dispersion, in which the protective agent that chemically modifies silver nanoparticles is an organic molecule having a carbon skeleton with 3 carbon atoms, is achieved.

Subsequently, the obtained dispersion is adjusted so that the ultimate metal content (silver content) is within a range of 2.5 to 95% by mass with respect to the entire dispersion (i.e., 100% by mass). In addition, when an alcohol-containing aqueous solution is used as a dispersion medium, it is preferable to adjust the contents of the solvents, i.e., water and an alcohol, to at least 1% and to at least 2%, respectively. Moreover, when an additive is further contained in the composition, at least one additive selected from the group consisting of an organic polymer, a metal oxide, a metal hydroxide, an organic metal compound, and a silicone oil is added at a desired proportion. The content of the additive is adjusted within a range of 0.1 to 20% by mass with respect to the entire composition obtained (i.e., 100% by mass). Due to this adjustment, the composition where the silver nanoparticles are chemically modified by a protective agent, which is an organic molecule having a carbon skeleton with 3 carbon atoms, are dispersed in a dispersion medium is obtained.

(b) When the Protective Agent which Chemically Modifies Silver Nanoparticles is an Organic Molecule Having a Carbon Skeleton with 2 Carbon Atoms A dispersion liquid is prepared in the same manner as described in the abovementioned section (a) except that sodium citrate used for preparing the aqueous solution of a reducing agent is replaced with sodium malate. Due to this preparation, the dispersion, in which the protective agent that chemically modifies silver nanoparticles is an organic molecule having a carbon skeleton with 2 carbon atoms, is achieved.

(c) When the Protective Agent which Chemically Modifies Silver Nanoparticles is an Organic Molecule Having a Carbon Skeleton with 1 Carbon Atom A dispersion liquid is prepared in the same manner as described in the abovementioned section (a) except that sodium citrate used for preparing the aqueous solution of a reducing agent is replaced with sodium glycolate. Due to this preparation, the dispersion, in which the protective agent that chemically modifies silver nanoparticles is an organic molecule having a carbon skeleton with 1 carbon atom, is obtained.

(d) When the Protective Agent which Chemically Modifies Metal Nanoparticles Excluding Silver Nanoparticles is an Organic Molecule Having a Carbon Skeleton with 3 Carbon Atoms Examples of the metals that constitute the metal nanoparticles other than the silver particles include gold, platinum, palladium, ruthenium, nickel, copper, tin, indium, zinc, iron, chromium, and manganese. A dispersion liquid is prepared in the same manner as described in the abovementioned section (a) except that silver nitrate used for preparing the aqueous metal salt solution is replaced with hydrogen tetrachloroaurate, dihydrogen hexachloroplatinate, palladium nitrate, ruthenium trichloride, nickel chloride, cuprous nitrate, tin dichloride, indium nitrate, zinc chloride, iron sulfate, chromium sulfate, or manganese sulfate. Due to this preparation, the dispersion, in which the protective agent that chemically modifies metal nanoparticles other than the silver nanoparticles is an organic molecule having a carbon skeleton with 3 carbon atoms, is obtained.

It should be noted that when the protective agent which chemically modifies the metal nanoparticles other than the silver nanoparticles is an organic molecule having a carbon skeleton with 1 or 2 carbon atoms, dispersions are prepared in the same manner as in the abovementioned sections (b) and (c) except that silver nitrate used for preparing the aqueous metal salt solution is replaced with the above listed metal salts. Due to this preparation, the dispersion, in which the protective agent that chemically modifies the metal nanoparticles other than the silver nanoparticles is an organic molecule having a carbon skeleton with 1 or 2 carbon atoms, is obtained.

When preparing a dispersion liquid that contains the metal nanoparticles other than the silver nanoparticles together with the silver particles, for example, 75% by mass or more of the dispersion containing the silver nanoparticles produced by the above method (a) (first dispersion) and 25% by mass or less of the dispersion containing the metal nanoparticles other than the silver nanoparticles produced by the above method (d) (second dispersion) are mixed so as to make the total content 100% by mass. Note that the above first dispersion is not limited to the dispersion containing the silver nanoparticles produced by the above method (a) and the dispersions containing the silver nanoparticles produced by the above methods (b) and (c) may also be used.

In the method for producing a conductive reflective film of the present invention, the abovementioned composition is first coated directly on a substrate or on a layer laminated on a substrate by a wet coating method to form a coating film so that the film thickness after the calcination process will be 0.05 to 2.0 μm, preferably 0.1 to 1.5 μm.

As the substrate, a transparent substrate formed from any one of glass, ceramics containing a transparent conductive material, and a polymeric material, or a transparent laminate formed from at least two materials selected from the group consisting of glass, ceramics containing a transparent conductive material, a polymeric material, and silicon can be used. In addition, the substrate containing at least one of the following transparent conductive films or the substrate on which a transparent conductive film is formed may be used as the above substrate. Examples of the transparent conductive film include an indium oxide-based film, tin oxide-based film, and zinc oxide-based film. Examples of the indium oxide-based film include an indium oxide film, an indium tin oxide (ITO) film, and an indium zinc oxide (IZO) film. Examples of the tin oxide-based film include a Nesa ($SnO_2$) film, an antimony-doped tin oxide (ATO) film, and a fluorine-doped tin oxide film. Examples of the zinc oxide-based film include a zinc oxide film, an aluminum-doped zinc oxide (AZO) film, and a gallium-doped zinc oxide film. The substrate is preferably either a solar cell element or a solar cell element attached with a transparent electrode. Examples of the transparent electrode include an ITO electrode, an ATO electrode, a Nesa electrode, an IZO electrode, and an AZO electrode. Moreover, it is also possible that a dielectric thin film such as a lead zirconate titanate (PZT) film is formed on the substrate surface. Examples of the polymeric substrate include a substrate formed from organic polymers such as polyimide and polyethylene terephthalate (PET). The above dispersion is coated on the surface of a photoelectric conversion semiconductor layer of the solar cell element or the surface of a transparent electrode of the solar cell element attached with a transparent electrode.

Moreover, although the above wet coating method is particularly preferably any one of a spray coating method, a dispenser coating method, a spin coating method, a knife coating method, a slit coating method, an ink jet coating method, a screen printing method, an offset printing method, and a die coating method, the method is not limited to the above and any method can be employed.

The spray coating method is a method in which a dispersion liquid is made into spray using compressed air and coated on a substrate, or a dispersion liquid itself is pressurized to be made into a spray and then coated on a substrate. The dispenser coating method is a method in which a dispersion liquid is put in a syringe and the dispersion is coated on a substrate by pressing the piston of the syringe to discharge the dispersion from the fine nozzle at the tip of the syringe. The spin coating method is a method in which a dispersion liquid is added dropwise on a rotating substrate and the dropped dispersion is then spread to the substrate periphery by centrifugal force. The knife coating method is a method in which a substrate is provided with a predetermined distance from the tip of a knife so as to be movable in the horizontal direction, and a dispersion liquid is supplied onto the substrate, which is in the upstream side of this knife, followed by the horizontal movement of the substrate towards the downstream side. The slit coating method is a method in which a dispersion liquid is discharged from a narrow slit to be coated on a substrate. The ink jet coating method is a method in which a dispersion liquid is filled in an ink cartridge of a commercially available ink jet printer followed by the ink jet printing process on a substrate. The screen printing method is a method in which a gauze is used as a pattern reference and a dispersion liquid is transferred to a substrate through the printed image formed on the gauze. The offset printing method is a printing method in which a dispersion liquid attached to a block is not directly transferred to a substrate, but rather transferred once to a rubber sheet from the block and then transferred to the substrate from the rubber sheet so as to exploit the water repellency of ink. The die coating method is a method in which a dispersion liquid supplied in a die is dispensed by a manifold and extruded on a thin film from a slit so as to coat the surface of a running substrate. The die coating method includes a slot coating method, a slide coating method, and a curtain coating method.

Then the substrate including a coating film is calcined by being retained in air or in an inert gas atmosphere such as nitrogen and argon at 130 to 400° C., preferably at 150 to 350° C., for 5 minutes to 1 hour, preferably 15 to 40 minutes. The coating process through the wet coating method is carried out so that the film thickness after the calcination process will be within a range of 0.05 to 2.0 µm because a film thickness of less than 0.05 µm will result in the surface resistance value of the electrode being insufficient for the level required for the solar cells. In addition, although the film thickness of more than 2.0 µm does not result in any deficiencies of film properties, the amount of materials used to prepare the film will be unnecessarily large.

The substrate including a coating film is calcined within a temperature range of 130 to 400° C. because a temperature of less than 130° C. will result in insufficient sintering among the metal nanoparticles. Moreover, it will be difficult to eliminate or decompose (remove/combust) the protective agent by the heat during the calcination process, thereby leaving a large amount of organic in the conductive reflective film after the calcination process resulting in the reduction of electrical conductivity and reflectance of the conductive reflective film due to the deterioration or the degradation of these residues. In addition, the advantage of the present invention in the production process, which is a low temperature process, cannot be fully exploited if the calcination temperature exceeds 400° C. In other words, when the calcination temperature exceeds 400° C., the production cost increases and the productivity reduces, and in particular, the light wavelength range of the photoelectric conversion in the solar cells using amorphous silicon, microcrystalline silicon, or their hybrid silicon is affected.

The substrate including a coating film is calcined for 5 minutes to 1 hour because a duration of less than 5 minutes will result in insufficient sintering among the metal nanoparticles. Moreover, it will be difficult to eliminate or decompose (remove/combust) the protective agent by the heat during the calcination process, thereby leaving a large amount of organic in the conductive reflective film after the calcination process resulting in the reduction of electrical conductivity and reflectance of the conductive reflective film due to the deterioration or the degradation of these residues. In addition, although a calcination time of more than 1 hour does not affect the film properties, the production cost is unnecessarily increased and productivity is reduced.

Among the additives, PVP, copolymers of PVP, and water-soluble cellulose which are organic polymers are known to gradually start undergoing the pyrolysis process from about 200 to 300° C. in air, although their decomposition rates are extremely slow. However, decomposition rapidly proceeds when the temperature exceeds 400° C. For example, when the metal nanoparticles are calcined at 130° C. for 10 minutes, 90% or more of the organic molecules thereof before the calcination process remain in the film after the process. On the other hand, when the metal nanoparticles are calcined at 400° C. for 10 minutes, 50% or more of the organic molecules thereof before the calcination process remain in the film after the process.

By calcining the substrate under the abovementioned conditions, a conductive reflective film can be formed on the substrate or on the layer, which is laminated on the substrate. As described above, the production method of the present invention is capable of forming a conductive reflective film through a simple process, where the abovementioned composition is coated on a substrate or on a layer, which is laminated on a substrate, by the wet coating method followed by the calcination of the substrate including a coating film. Since no vacuum process is required when forming the film, there are few restrictions on the process and the cost for running manufacturing facilities can be reduced considerably.

The conductive reflective film of the present invention which is obtained by the above production method is characterized by the pores which appear on the film contact surface in the substrate side having an average diameter of 100 nm or less, an average depth of 100 nm or less in terms of pore position, and a number density of 30 pores/µm$^2$ or less.

Note that the film contact surface in the substrate side refers to the film surface contacting a substrate when the conductive reflective film is formed directly on the substrate, and refers to the film surface contacting a layer when the conductive reflective film is formed on the layer, which is laminated on the substrate.

By making the average diameter of the pores which appear on the film contact surface in the substrate side smaller, the average depth of the pore position smaller, and the number density of pores lower, the inflection point, where the reflection spectrum measured from the substrate side starts to reduce, shifts to the low wavelength side when such a conductive reflective film is formed on a transparent substrate such as glass or on a layer laminated on the substrate.

In the conductive reflective film of the present invention, the pores appearing on the film contact surface in the substrate side will have an average diameter of 100 nm or less in terms of pore size, an average depth of 100 nm or less in terms of pore position, and a number density of 30 pores/$\mu m^2$ or less. Due to the above conditions, the conductive reflective film of the present invention can achieve a high diffuse reflectance, which is 80% or more of the theoretical reflectance, within a wavelength range of 500 to 1200 nm when a transparent substrate having a transmittance of 98% or more is used. This wavelength range of 500 to 1200 nm covers almost the entire wavelength of convertible light when polycrystalline silicon is used in the photoelectric conversion layer. Moreover, the conductive reflective film of the present invention can achieve a specific resistance which is comparable to that of the metal itself that constitutes the metal nanoparticles contained in the composition. In other words, the obtained specific resistance is as low as that of the bulk, which can be used as an electrode for solar cells. In addition, the conductive reflective film of the present invention is excellent compared to the films formed by employing the vacuum process such as a sputtering process in terms of long-term stability of the reflectance, the adhesive properties, and the specific resistance of the film, and the like. The reason for the above characteristics is that the conductive reflective film of the present invention which is formed in air is unlikely to be affected by the infiltration of water or an oxidation process compared to the film formed in vacuum.

Since the conductive reflective film of the present invention has a high reflectance when measured from the substrate side and also exhibits a specific resistance as low as that of a bulk, it can be used as the electrode in a solar cell.

EXAMPLES

Next, Examples of the present invention will be described in detail with Comparative Examples.

Examples 1 to 37

Silver nitrate was first dissolved in deionized water to prepare an aqueous metal salt solution. In addition, sodium citrate was dissolved in deionized water to prepare an aqueous sodium citrate solution having a concentration of 26% by mass. Granular ferrous sulfate is directly added to this aqueous sodium citrate solution for dissolution in a flow of nitrogen gas kept at a temperature of 35° C., thereby preparing an aqueous solution of a reducing agent containing citrate ions and ferrous ions at a molar ratio of 3:2.

Subsequently, while stirring the above aqueous reducing-agent solution in the flow of nitrogen gas maintained at a temperature of 35° C. by putting a magnetic stirring bar in the aqueous reducing-agent solution and rotating the stirring bar at a rotational speed of 100 rpm, the abovementioned aqueous metal salt solution was added dropwise to mix with the aqueous reducing-agent solution. In this process, the concentration of each solution was adjusted so that the amount of aqueous metal salt solution added to the aqueous reducing-agent solution was 1/10 or less of the amount of aqueous reducing-agent solution, thereby holding the reaction temperature at 40° C. even though the aqueous metal salt solution was added at room temperature. Additionally, the mixture ratio between the above aqueous reducing-agent solution and the metal salt solution was adjusted so that the equivalent of ferrous ions added as a reducing agent was 3 times higher than that of the metal ions. After completing the dropwise addition of the metal salt solution to the reducing-agent solution, the mixture was further stirred for 15 minutes to generate metal particles in the mixture, thereby obtaining a dispersed liquid where metal particles were dispersed. The pH of the metal particle-dispersed liquid was 5.5 and the amount of metal particles produced stoichiometrically in the dispersed liquid was 5 g/L.

The metal particles in the dispersed liquid was precipitated by allowing the obtained dispersed liquid to stand at room temperature and the aggregates of precipitated metal particles were separated by decantation. Then deionized water was added to the separated metal aggregates to produce a dispersion liquid, and the dispersion liquid was subjected to a desalination treatment by employing ultrafiltration and then was further subjected to displacement washing by methanol so that the metal (silver) content was 50% by mass. Thereafter, by separating relatively large silver particles having a particle size exceeding 100 nm using a centrifugal separator and adjusting the centrifugal force of this centrifugal separator, an adjustment was made so that the content of silver nanoparticles which had a primary particle size within a range of 10 to 50 nm was 71% in terms of the average based on the number of particles. In other words, an adjustment was made so that the proportion of silver nanoparticles having a primary particle size within a range of 10 to 50 nm was, in terms of average based on numbers, 71% with respect to the entirety of the silver nanoparticles (i.e., 100%). The obtained silver nanoparticles were chemically modified a protective agent which was an organic molecule having a carbon skeleton with 3 carbon atoms.

Next, 10 parts by mass of the obtained metal nanoparticles were added and mixed with 90 parts by mass of a mixed solution containing water, ethanol, and methanol for dispersion. Moreover, the additives shown in the following Tables 1 to 3 were added to this dispersion liquid so as to achieve the proportions shown in Tables 1 to 3, thereby obtaining compositions for the coating test. It should be noted that the metal particles which constituted the compositions for the coating test contained 75% by mass or more of silver nanoparticles.

It should be noted that when preparing a dispersion liquid that contains the metal nanoparticles other than the silver nanoparticles together with the silver particles, the dispersion liquid containing the silver nanoparticles produced by the above method was used as a first dispersion liquid. Moreover, a dispersion liquid that contains the metal nanoparticles other than the silver nanoparticles was prepared as in the above method for preparing the dispersion liquid containing the silver nanoparticles except that the metal salts shown in Tables 1 to 3 used for preparing a dispersion liquid that contains the metal nanoparticles other than the silver nanoparticles were used instead of silver nitrate. The prepared dispersion liquid of metal salts was used as a second dispersion liquid. Next, before adding an additive, the first and the second dispersion liquids were mixed so as to achieve the proportions shown in the following Tables 1 to 3 to obtain compositions for the coating test.

The obtained compositions for the coating test were coated on the substrates shown in the following Tables 1 to 3 using various film-forming methods so that the film thickness after the calcination process would be $10^2$ to $2\times10^3$ nm. Thereafter, by calcining the coating film under the heat treatment conditions shown in the following Tables 1 to 3, a conductive reflective film was formed on the substrate.

Note that in Tables 1 to 3, PVP represents polyvinylpyrrolidone having a Mw of 360,000, ITO represents indium tin oxide, ATO represents antimony tin oxide, and PET represents polyethylene terephthalate.

Comparative Examples 1 to 3

The respective compositions for the coating test were obtained as in Examples 1 to 37 except that no additive was added and the types of metal nanoparticles added and their ultimate proportions were those shown in the following Table 3.

The obtained compositions for the coating test were coated on the substrates shown in the following Table 3 using various film formation methods so that the film thickness after the calcination process will be $10^2$ to $2\times10^3$ nm. Thereafter, by calcining the coating film under the heat treatment conditions shown in the following Table 3, a conductive reflective film was formed on the substrate.

Comparative Example 4

The dispersion liquid subjected to displacement washing by methanol was adjusted using a centrifugal separator so that the content of silver nanoparticles which had a primary particle size within a range of 10 to 50 nm was 68% in terms of the average based on the number of particles. In other words, an adjustment was made so that the proportion of silver nanoparticles having a primary particle size within a range of 10 to 50 nm was, in terms of average based on numbers, 68% with respect to the entirety of the silver nanoparticles (i.e., 100%). Moreover, an adjustment was made so that the ultimate proportions of the mixed metal (silver), water, and methanol with respect to the entire dispersion liquid (i.e., 100% by mass) were 50.0% by mass, 2.5% by mass, and 47.5% by mass, respectively. The dispersion liquid was prepared as in Examples 1 to 37 except the abovementioned conditions and the obtained dispersion liquid was used as the composition for the coating test.

The obtained composition for the coating test was coated on the substrate shown in the following Table 3 so that the film thickness after the calcination process would be $2\times10^3$ nm. Thereafter, by calcining the coating film under the heat treatment conditions shown in the following Table 3, a conductive reflective film was formed on the substrate.

Examples 38 and 39

The respective compositions for the coating test were obtained as in Examples 1 to 37 except that the types of metal nanoparticles added and their ultimate proportions were those shown in the following Table 3 and that the additives shown in Table 3 were added so that their ultimate proportions achieved were those shown in Table 3. It should be noted that the metal particles which constituted the compositions for the coating test contained 75% by mass or more of silver nanoparticles.

Subsequently, on a glass where an uneven $SnO_2$ film was formed, amorphous Si films of p type (20 nm), i type (300 nm), and n type (30 nm) are sequentially formed using a plasma CVD apparatus. Then a 100 nm-thick ITO film was formed on this amorphous Si film using a sputtering Method. Subsequently, the obtained composition for the coating test was coated on the resultant so that the film thickness after the calcination process would be $3\times10^2$ nm. Thereafter, by calcining the coating film under the heat treatment conditions shown in the following Table 3, a conductive reflective film was formed on the substrate.

Comparative Example 5

The respective compositions for the coating test were obtained as in Examples 1 to 37 except that the types of metal nanoparticles added and their ultimate proportions were those shown in the following Table 3 and that the additives shown in Table 3 were added so that their ultimate proportions achieved were those shown in Table 3. It should be noted that the metal particles which constituted the compositions for the coating test contained 70% by mass of silver nanoparticles.

Subsequently, a substrate having the same configuration as that used in Examples 38 and 39 was prepared, and the obtained composition for the coating test was coated on this substrate so that the film thickness after the calcination process would be $3\times10^2$ nm. Thereafter, by calcining the coating film under the heat treatment conditions shown in the following Table 3, a conductive reflective film was formed on the substrate.

TABLE 1

| | Solid component contained in composition | | Film | | Heat treatment conditions | | |
|---|---|---|---|---|---|---|---|
| | Metal nanoparticles | Additive | formation method | Substrate | Temp. [° C.] | Time [min] | Atmosphere |
| Ex. 1 | Ag 94% by mass | PVP 5% by mass | Spray coating | Glass | 200 | 20 | Air |
| | | Ni acetate 1% by mass | | | | | |
| Ex. 2 | Ag 96% by mass | PVP 3% by mass | Spray coating | Glass/ITO | 200 | 20 | Air |
| | | Cu acetate 1% by mass | | | | | |
| Ex. 3 | Ag 89% by mass | PVP-dimethylaminoethylmethacrylate 5% by mass | Spray coating | Glass/ITO | 200 | 20 | Air |
| | Au 5% by mass | Zn acetate 1% by mass | | | | | |
| Ex. 4 | Ag 72% by mass | Methylcellulose 3% by mass | Spray coating | Glass/ITO | 200 | 20 | Air |
| | Pd 24% by mass | Mo acetate 1% by mass | | | | | |
| Ex. 5 | Ag 94% by mass | Hydroxypropylmethylcellulose 3% by mass | Spray coating | Glass | 200 | 20 | Air |
| | Ru 2% by mass | Sn acetate 1% by mass | | | | | |
| Ex. 6 | Ag 92% by mass | PVP 3% by mass | Dispenser coating | Glass | 130 | 20 | $N_2$ |
| | Cu 4% by mass | Sn acetate 1% by mass | | | | | |
| Ex. 7 | Ag 95.8% by mass | PVP 3% by mass | Dispenser coating | Glass | 200 | 20 | Air |
| | Sn 0.2% by mass | Sn acetate 1% by mass | | | | | |
| Ex. 8 | Ag 96.8% by mass | PVP 2% by mass | Dispenser coating | Glass | 130 | 20 | Air |
| | In 0.2% by mass | Sn acetate 1% by mass | | | | | |
| Ex. 9 | Ag 95.8% by mass | PVP 3% by mass | Offset printing | Glass | 320 | 20 | Air |
| | Zn 0.2% by mass | Sn acetate 1% by mass | | | | | |
| Ex. 10 | Ag 95.8% by mass | PVP 3% by mass | Offset printing | Glass | 320 | 20 | Air |
| | Fe 0.2% by mass | Zn acetate 1% by mass | | | | | |
| Ex. 11 | Ag 96.7% by mass | PVP 3% by mass | Screen printing | Glass | 150 | 20 | Air |
| | Cr 0.2% by mass | Ni acetate 0.1% by mass | | | | | |

TABLE 1-continued

| | Solid component contained in composition | | Film | | Heat treatment conditions | | |
|---|---|---|---|---|---|---|---|
| | Metal nanoparticles | Additive | formation method | Substrate | Temp. [° C.] | Time [min] | Atmosphere |
| Ex. 12 | Ag 96.7% by mass Mn 0.2% by mass | PVP 3% by mass Ni acetate 0.1% by mass | Screen printing | Glass | 150 | 20 | Air |
| Ex. 13 | Ag 90% by mass | PVP 9% by mass Al$_2$O$_3$ 1% by mass | Knife coating | Glass | 150 | 60 | Air |
| Ex. 14 | Ag 99% by mass | PVP 0.9% by mass SiO$_2$ 0.1% by mass | Slit coating | Glass | 400 | 60 | Air |
| Ex. 15 | Ag 95% by mass | PVP 4% by mass TiO$_2$ 1% by mass | Spin coating | Glass | 150 | 20 | Air |

TABLE 2

| | Solid component contained in composition | | Film | | Heat treatment conditions | | |
|---|---|---|---|---|---|---|---|
| | Metal nanoparticles | Additive | formation method | Substrate | Temp. [° C.] | Time [min] | Atmosphere |
| Ex. 16 | Ag 95% by mass | PVP 4% by mass Cr$_2$O$_3$ 1% by mass | Spin coating | Glass | 150 | 20 | Air |
| Ex. 17 | Ag 95% by mass | PVP 4% by mass MnO$_2$ 1% by mass | Spin coating | Glass | 150 | 20 | Air |
| Ex. 18 | Ag 95% by mass | PVP 4% by mass Fe$_2$O$_3$ 0.5% by mass + Co$_3$O$_4$ 0.5% by mass | Spin coating | Glass | 150 | 20 | Air |
| Ex. 19 | Ag 95% by mass | PVP 4% by mass Ag$_2$O 1% by mass | Spin coating | Glass | 150 | 20 | Air |
| Ex. 20 | Ag 95% by mass | PVP 4% by mass Cu(OH)$_2$ 1% by mass | Spin coating | Glass | 150 | 20 | Ar |
| Ex. 21 | Ag 95% by mass | PVP 4% by mass ZnO 1% by mass | Spin coating | PET | 150 | 20 | Air |
| Ex. 22 | Ag 95% by mass | PVP 4% by mass MoO$_2$ 1% by mass | Spin coating | PET | 150 | 20 | Air |
| Ex. 23 | Ag 95% by mass | PVP 4% by mass SnO$_2$ 1% by mass | Spin coating | PET | 150 | 20 | Air |
| Ex. 24 | Ag 95% by mass | PVP 4% by mass ITO 1% by mass | Spin coating | PET | 150 | 20 | Air |
| Ex. 25 | Ag 95% by mass | PVP 4% by mass ATO 1% by mass | Spin coating | PET | 150 | 20 | Air |
| Ex. 26 | Ag 95% by mass | PVP 4% by mass Methyl silicate 1% by mass | Spin coating | PET | 150 | 20 | Air |
| Ex. 27 | Ag 95% by mass | PVP 4% by mass Ti isopropoxide 1% by mass | Spin coating | PET | 150 | 20 | Air |
| Ex. 28 | Ag 95% by mass | PVP 4% by mass Ammonium chromate 1% by mass | Spin coating | PET | 150 | 20 | Air |
| Ex. 29 | Ag 95.9% by mass | PVP 4% by mass Mn formate 0.01% by mass | Spin coating | PET | 150 | 20 | Air |
| Ex. 30 | Ag 95.9% by mass | PVP 4% by mass Fe citrate 0.01% by mass | Spin coating | PET | 150 | 20 | Air |

TABLE 3

| | Solid component contained in composition | | Film | | Heat treatment conditions | | |
|---|---|---|---|---|---|---|---|
| | Metal nanoparticles | Additive | formation method | Substrate | Temp. [° C.] | Time [min] | Atmosphere |
| Ex. 31 | Ag 95.9% by mass | PVP 4% by mass Co formate 0.01% by mass | Spin coating | PET | 200 | 20 | Air |
| Ex. 32 | Ag 95% by mass | Ni acetate 5% by mass | Spin coating | PET | 150 | 20 | Air |
| Ex. 33 | Ag 95% by mass | PVP 4% by mass Ag citrate 1% by mass | Spin coating | PET | 150 | 20 | Air |
| Ex. 34 | Ag 95% by mass | Cu acetate 5% by mass | Spin coating | PET | 150 | 20 | N$_2$ |
| Ex. 35 | Ag 95% by mass | Zn acetate 5% by mass | Spin coating | PET | 150 | 20 | Air |
| Ex. 36 | Ag 95% by mass | Mo acetate 5% by mass | Spin coating | PET | 150 | 20 | Air |

TABLE 3-continued

| | Solid component contained in composition | | Film formation method | Substrate | Heat treatment conditions | | |
|---|---|---|---|---|---|---|---|
| | Metal nanoparticles | Additive | | | Temp. [° C.] | Time [min] | Atmosphere |
| Ex. 37 | Ag 95% by mass | Sn acetate 5% by mass | Die coating | PET | 150 | 20 | Air |
| Ex. 38 | Ag 97% by mass | Ni acetate 3% by mass | Spin coating | Amorphous Solar cell | 200 | 10 | Air |
| Ex. 39 | Ag 98% by mass | Methylcellulose 2% by mass | Spray coating | Amorphous Solar cell | 180 | 30 | Air |
| Comp. Ex. 1 | Ag 95% by mass Cu 5% by mass | None | Spray coating | Glass | 100 | 20 | Air |
| Comp. Ex. 2 | Ag 76% by mass Pd 24% by mass | None | Spray coating | Glass | 120 | 20 | Air |
| Comp. Ex. 3 | Ag 95% by mass Cu 5% by mass | None | Spray coating | Glass | 120 | 20 | Air |
| Comp. Ex. 4 | Ag 99.9% by mass | Ni acetate 0.01% by mass | Spray coating | Glass | 120 | 5 | Air |
| Comp. Ex. 5 | Ag 70% by mass Pd 25% by mass | PVP 5% by mass | Die coating | Amorphous Solar cell | 180 | 30 | Air |

<Comparison Test 1>

The pore distribution in the film contact surface in the substrate side, the reflectance measured from the substrate side, and the thickness of the conductive reflective film were evaluated with respect to the substrates obtained in Examples 1 to 37 and Comparative Examples 1 to 4 where conductive reflective films were formed. Evaluation results are shown in the following Tables 4 and 5.

Different measuring methods were used for measuring pores depending on whether it was possible to separate the conductive reflective film from the substrate or not.

When dealing with the conductive reflective film which was separable from the substrate, an adhesive was first coated on a jig having a smooth surface, and this jig was then pressed against the conductive reflective film adhered on the substrate and was held until the adhesive was sufficiently dried to exhibit high adhesive force. Thereafter, this jig was pulled upward perpendicularly with respect to the substrate using a tensile tester (EZ-TEST manufactured by Shimadzu Corporation) to separate the conductive reflective film from the substrate.

Then, with respect to a surface, which was the film contact surface in the substrate side and which was exposed on the jig after being separated from the substrate, an image was taken for observing the unevenness of this surface using an atomic force microscope (AFM). The observed image of surface unevenness was analyzed to evaluate the average diameter, the average depth, and the number density of the pores appearing on the film surface. It should be noted that the average diameter was determined by measuring the diameters of maximum pores and minimum pores appearing on the film surface and calculating the average thereof.

In addition, a method, in which a tape was pasted on the conductive reflective film and the conductive reflective film was separated from the substrate by pulling one end of the tape, was also used concomitantly as another approach to separate the conductive reflective film from the substrate.

When dealing with the conductive reflective film which was inseparable from the substrate, the conductive reflective film adhered on the substrate was first subjected to focused ion beam (FIB) processing so that the cross section of samples was exposed. By observing the cross section of samples using a scanning electron microscope (SEM), the shape of the interface between the metal film and the substrate was examined. This image of the interface was analyzed to evaluate the average diameter, the average depth, and the number density of the pores. Note that the evaluation was made by regarding the length of the pores in the image as the diameter of the pores.

Evaluation on the reflectance of the conductive reflective films was made by measuring the diffuse reflectance of the conductive reflective films at the wavelength of 500 nm and 1100 nm using an ultraviolet and visible spectrophotometer and an integrating sphere simultaneously.

The film thickness of the conductive reflective film was measured by cross sectional observation using a scanning electron microscope (SEM).

TABLE 4

| | Pore distribution in the film contact surface in the substrate side | | | Reflectance from the substrate side | | Film thickness [nm] |
|---|---|---|---|---|---|---|
| | Average diameter [nm] | Average depth [nm] | Number density [pores/μm$^2$] | 500 nm | 1100 nm | |
| Ex. 1 | 70 | 70 | 20 | 85 | 95 | $1.0 \times 10^2$ |
| Ex. 2 | 80 | 50 | 10 | 85 | 95 | $5.0 \times 10^2$ |
| Ex. 3 | 89 | 50 | 10 | 80 | 90 | $1.0 \times 10^3$ |
| Ex. 4 | 70 | 90 | 5 | 82 | 92 | $1.1 \times 10^3$ |
| Ex. 5 | 90 | 50 | 10 | 82 | 92 | $1.0 \times 10^3$ |
| Ex. 6 | 90 | 70 | 20 | 84 | 94 | $1.2 \times 10^3$ |
| Ex. 7 | 80 | 60 | 15 | 84 | 94 | $1.0 \times 10^3$ |
| Ex. 8 | 70 | 45 | 22 | 91 | 94 | $1.0 \times 10^3$ |
| Ex. 9 | 90 | 70 | 16 | 85 | 93 | $1.9 \times 10^3$ |
| Ex. 10 | 80 | 60 | 20 | 84 | 94 | $1.8 \times 10^3$ |
| Ex. 11 | 70 | 50 | 20 | 84 | 94 | $2.0 \times 10^3$ |
| Ex. 12 | 60 | 90 | 10 | 82 | 92 | $2.0 \times 10^3$ |
| Ex. 13 | 50 | 95 | 5 | 87 | 95 | $2.0 \times 10^3$ |
| Ex. 14 | 90 | 80 | 20 | 82 | 81 | $1.9 \times 10^3$ |
| Ex. 15 | 70 | 60 | 25 | 83 | 93 | $1.0 \times 10^3$ |
| Ex. 16 | 80 | 65 | 15 | 80 | 95 | $1.1 \times 10^3$ |
| Ex. 17 | 90 | 60 | 20 | 90 | 91 | $1.0 \times 10^3$ |
| Ex. 18 | 40 | 50 | 10 | 92 | 92 | $1.2 \times 10^3$ |
| Ex. 19 | 30 | 30 | 10 | 94 | 94 | $1.2 \times 10^3$ |
| Ex. 20 | 50 | 50 | 10 | 90 | 90 | $1.0 \times 10^3$ |

TABLE 5

| | Pore distribution in the film contact surface in the substrate side | | | Reflectance from the substrate side | | Film |
|---|---|---|---|---|---|---|
| | Average diameter [nm] | Average depth [nm] | Number density [pores/μm²] | 500 nm | 1100 nm | thickness [nm] |
| Ex. 21 | 80 | 80 | 20 | 82 | 85 | $1.0 \times 10^3$ |
| Ex. 22 | 90 | 90 | 28 | 81 | 81 | $1.0 \times 10^3$ |
| Ex. 23 | 80 | 75 | 25 | 82 | 82 | $1.0 \times 10^3$ |
| Ex. 24 | 50 | 90 | 20 | 82 | 85 | $1.1 \times 10^3$ |
| Ex. 25 | 70 | 80 | 15 | 83 | 84 | $1.0 \times 10^3$ |
| Ex. 26 | 60 | 90 | 20 | 83 | 85 | $1.1 \times 10^3$ |
| Ex. 27 | 40 | 50 | 15 | 82 | 82 | $1.0 \times 10^3$ |
| Ex. 28 | 95 | 95 | 12 | 80 | 88 | $1.1 \times 10^3$ |
| Ex. 29 | 80 | 85 | 5 | 85 | 88 | $1.0 \times 10^3$ |
| Ex. 30 | 55 | 80 | 10 | 89 | 90 | $1.0 \times 10^3$ |
| Ex. 31 | 50 | 90 | 5 | 88 | 91 | $1.2 \times 10^3$ |
| Ex. 32 | 80 | 80 | 10 | 86 | 86 | $1.1 \times 10^3$ |
| Ex. 33 | 70 | 60 | 15 | 88 | 88 | $1.0 \times 10^3$ |
| Ex. 34 | 90 | 60 | 20 | 85 | 85 | $1.0 \times 10^3$ |
| Ex. 35 | 80 | 90 | 10 | 82 | 82 | $1.0 \times 10^3$ |
| Ex. 36 | 80 | 70 | 20 | 83 | 83 | $1.1 \times 10^3$ |
| Ex. 37 | 90 | 50 | 10 | 84 | 84 | $1.0 \times 10^3$ |
| Comp. Ex. 1 | 150 | 50 | 10 | 70 | 80 | $1.0 \times 10^2$ |
| Comp. Ex. 2 | 10 | 150 | 10 | 75 | 90 | $1.0 \times 10^2$ |
| Comp. Ex. 3 | 50 | 50 | 55 | 70 | 83 | $1.0 \times 10^2$ |
| Comp. Ex. 4 | 150 | 150 | 20 | 65 | 75 | $1.0 \times 10^2$ |

As is apparent from Tables 4 and 5, in Comparative Example 1 where the average diameter of pores in the film contact surface in the substrate side was large, the reflectance was low at 500 nm exhibiting 70% and the reflectance at 1100 nm was also low. In addition, in Comparative Example 2 where the average depth of pores in the film contact surface in the substrate side was large, the reflectance was low at 500 nm exhibiting 75% although the reflectance at 1100 nm was high exhibiting 90%. Hence, the results verified that there were variations in the reflectance depending on the light wavelength. In Comparative Example 3 where the number density of pores in the film contact surface in the substrate side was high, the reflectance was low at 500 nm exhibiting 70% and the reflectance at 1100 nm was also tend to be low. Moreover, in Comparative Example 4 where the average diameter of pores in the film contact surface in the substrate side was large, the reflectance was low at both wavelengths of 500 nm and 1100 nm. On the other hand, in Examples 1 to 37, a high reflectance of 80% or more was achieved at both wavelengths of 500 nm and 1100 nm.

<Comparison Test 2>

The pore distribution in the film contact surface in the substrate side, the photoelectric conversion efficiency, and the thickness of conductive reflective film were evaluated with respect to the substrates obtained in Examples 38 and 39 and Comparative Example 5 where conductive reflective films were formed. Evaluation results are shown in the following Table 6. Note that the pore measurements and the film thickness measurement were carried out using the same approach as described earlier in Comparison test 1. In addition, in terms of the measurement of photoelectric conversion efficiency, the photoelectric conversion efficiency was determined by irradiating light having an amplitude modulation (AM) of 1.5 on the substrate at a light quantity of 100 mW/cm² at 25° C. using a solar simulator,

TABLE 6

| | Pore distribution in the film contact surface in the substrate side | | | Photo-electric conversion efficiency [%] | Film thickness [nm] |
|---|---|---|---|---|---|
| | Average diameter [nm] | Average depth [nm] | Number density [pores/μm²] | | |
| Ex. 38 | 50 | 50 | 15 | 8 | $3.0 \times 10^2$ |
| Ex. 39 | 40 | 30 | 20 | 8 | $3.0 \times 10^2$ |
| Comp. Ex. 5 | 70 | 120 | 40 | 6 | $3.0 \times 10^2$ |

As is apparent from Table 6, high photoelectric conversion efficiencies were achieved in Examples 38 and 39 whereas in Comparative Example 5 where the average depth of pores in the film contact surface in the substrate side was large and the number density of pores in the film contact surface in the substrate side was high, the photoelectric conversion efficiency was lower.

In the present invention, it is possible to obtain a mirror by forming a film on the back surface of a transparent substrate since a mirror surface is readily obtained.

In addition, the most important application of the present invention is its use in the super straight-type thin film solar cells which are characterized by having a transparent substrate such as glass as a light receiving surface. This type of solar cell is required to have high reflectance in the substrate side of the formed conductive reflective film. By using the present invention, the conductive reflective films which have conventionally been formed by the vacuum film formation method can be replaced by the conductive reflective films which are formed by coating the composition containing metal nanoparticles on a substrate followed by the calcination of the resultant. Hence, a considerable reduction in the production cost can be expected.

What is claimed is:

1. A method for producing a conductive reflective film comprising:

a step of preparing a composition by dispersing metal nanoparticles where 75% by mass or more particles are silver particles in a dispersion medium so that 70% or more of the metal nanoparticles, in terms of number average, contained in the composition will have a primary particle size within a range of 10 to 50 nm;

a step of coating the composition on a substrate or a layer which is laminated on the substrate using a wet coating method so that a film thickness after calcining is within a range of 0.05 to 2.0 µm; and a step of forming a film in which pores appearing on the film contact surface in the substrate side have an average diameter of 100 nm or less, an average depth in terms of a position of the pores is 100 nm or less, and a number density of the pores is 30 pores/µm$^2$ or less and 5 pores/µm$^2$ or more, by calcining the substrate with a coating film, which is obtained by the step of coating, at a temperature in a range of 130 to 150° C. for a period of 5 minutes to 1 hour in an inert gas atmosphere, wherein, in the step of preparing the composition, the metal nanoparticles are chemically modified by a protective agent which is an organic molecule having a carbon skeleton with 1 to 3 carbon atoms, and then an additive of polyvinylpyrrolidone and tin acetate, an additive of polyvinylpyrrolidone and copper(II) hydroxide, or an additive of copper acetate is added to the composition, wherein, an amount of the additive is 0.1 to 20% by mass with respect to the silver particles that constitute the metal nanoparticles, and wherein, after the calcining, the conductive reflective film has a resistance which is similar to a resistance of a metal that constitutes the metal nanoparticles contained in the composition.

2. The method for producing a conductive reflective film according to claim 1, wherein, the composition is produced by using an aqueous metal salt solution, and the aqueous metal salt solution includes silver nitrate.

3. The method for producing a conductive reflective film according to claim 2, wherein, the aqueous metal salt solution further includes at least one compound selected from the group consisting of hydrogen tetrachloroaurate, dihydrogen hexachloroplatinate, palladium nitrate, ruthenium trichloride, nickel chloride, cuprous nitrate, tin dichloride, indium nitrate, zinc chloride, iron sulfate, chromium sulfate, and manganese sulfate.

4. The method for producing a conductive reflective film according to claim 1, wherein, the protective agent which is the organic molecule having the carbon skeleton with 1 to 3 carbon atoms is obtained by dissolving in water at least one compound selected from the group consisting of sodium citrate, sodium malate, and sodium glycolate and subjected to a reducing reaction.

5. The method for producing a conductive reflective film according to claim 1, wherein, after the calcining, the conductive reflective film has 80% or more of a theoretical reflectance within a wavelength range of 500 to 1200 nm.

* * * * *